(12) United States Patent
Takegawa et al.

(10) Patent No.: US 6,995,915 B2
(45) Date of Patent: Feb. 7, 2006

(54) MANUFACTURING METHOD OF MICRO-LENS, MANUFACTURING METHOD OF SOLID-STATE IMAGE PICKUP DEVICE AND SOLID-STATE IMAGE PICKUP DEVICE

(75) Inventors: Kazuyuki Takegawa, Ichinomiya (JP); Ryoji Matsui, Anpachi-cho (JP); Tetsuya Yamada, Gifu (JP); Tsutomu Imai, Anpachi-cho (JP); Seiji Kai, Anpachi-cho (JP); Yuko Tanaka, Anjo (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/980,332

(22) Filed: Nov. 4, 2004

(65) Prior Publication Data

US 2005/0099695 A1    May 12, 2005

(30) Foreign Application Priority Data

Nov. 11, 2003 (JP) .............................. 2003-381683

(51) Int. Cl.
  G02B 27/10    (2006.01)
  G02B 3/00     (2006.01)
  C03B 11/08    (2006.01)
  C03B 23/22    (2006.01)
  B29D 11/00    (2006.01)

(52) U.S. Cl. .......................... 359/619; 359/620; 65/37; 264/1.32

(58) Field of Classification Search ........ 359/619–620, 359/628; 65/37, 39; 264/1.32, 1.7
See application file for complete search history.

(56) References Cited

U.S. PATENT DOCUMENTS 5,734,190 A * 3/1998 Hawkins et al. ............ 359/619

* cited by examiner

*Primary Examiner*—Georgia Epps
*Assistant Examiner*—Alicia M Harrington
(74) *Attorney, Agent, or Firm*—Oliff & Berridge, PLC

(57) ABSTRACT

The present invention intends to provide a manufacturing method of a heat resistant micro-lens. The manufacturing method includes forming on a substrate an inorganic film having the optical transparency; forming, at positions that are on the inorganic film and correspond to lens formation positions, a resist films; etching a portion where the resist films are not formed of the inorganic film; removing the resist films that remain; and irradiating inert gas ions to the inorganic film from which the resist films are removed and that is patterned according to the etching.

8 Claims, 3 Drawing Sheets

MANUFACTURING METHOD OF MICRO-LENS, MANUFACTURING METHOD OF SOLID-STATE IMAGE PICKUP DEVICE AND SOLID-STATE IMAGE PICKUP DEVICE

CROSS-REFERENCE TO RELATED APPLICATIONS

The priority application Number JP2003-381683 upon which this patent application is based is hereby incorporated by reference.

BACKGROUND OF THE INVENTION

The present invention relates to a manufacturing method of a micro-lens, a manufacturing method of a solid-state image pickup device and a solid-state image pickup device, in particular, a manufacturing technology of a micro-lens that is used in various kinds of optical devices.

A micro-lens (including an array of micro-lenses) is provided to an optical device such as a solid-state image pickup device and a liquid crystal display device. For instance, when a micro-lens is provided to a solid-state image pickup device, it is general that an organic film such as a color resist is formed at the upper-most layer followed by forming a micro-lens according to a thermal reflow method.

However, there is a problem in that an organic film is less resistant to heat. A heat-resistant micro-lens can generate various advantages. For instance, when a micro-lens is formed to a solid-state image pickup device by use of an organic film, it is difficult to form the lenses in the middle of process and to bring the lenses nearer to the respective photodiodes. However, it can be realized by use of an inorganic film.

SUMMARY OF THE INVENTION

The present invention is achieved in view of the above problems and intends to provide a manufacturing method that can form a heat resistant micro-lens, a manufacturing method of a solid-state image pickup device provided with a micro-lens that is resistant to heat, and a solid-state image pickup device.

In order to overcome the above problems, a manufacturing method involving the invention of a micro-lens includes forming on a substrate an inorganic film having the optical transparency; forming a resist film at positions that are on the inorganic film and correspond to lenses formation positions; etching a portion where the resist films are not formed of the inorganic film; removing the resist films that remain; and irradiating inert gas ions to the inorganic film from which the resist films are removed and that is patterned according to the etching.

According to a manufacturing method involving the invention, firstly, on a substrate, an inorganic film is formed. The substrate may be, for instance, various kinds of semiconductor substrates. In this case, the various kinds of semiconductor substrates may be ones provided with a photodiode and so on. The inorganic film has the optical transparency and is processed as lenses. The forming an inorganic film on a substrate may includes depositing, for instance, a silicon nitride film or a silicon oxide film on the substrate. Subsequently, resist films are formed on positions where the respective lenses are formed and that are on the inorganic film. The resist films may be formed of a positive resist material or a negative resist material.

Thereafter, portions where the resist films are not formed of the inorganic film are etched. The etching may be performed according to a dry etching process or a wet etching process. Thereafter, a remaining resist films are removed. Thus, at each of positions corresponding to the lens formation positions, projections are formed, and between positions where the lenses are formed a recess is formed. Then, inert gas ions are irradiated to the substrate that was etched and from which the resist films were removed and that has projections and the recess. The inert gas ions may include, for instance, argon ion. The inert gas ions are controlled in its energy of motion so as to ablate bonds of surface atoms or molecules of the inorganic film and to allow recombining with other atoms or molecules in an irradiation direction.

According to the invention, during the processing, projections are formed at positions of the lens formation positions, and atoms or molecules disposed at a circumference (periphery) of a top surface of each projection move in an irradiation direction owing to the irradiation of inert gas ions. Thus, the atoms or molecules at a circumference of a top surface of each projection move toward a circumference of a recess (periphery of a bottom portion), as it were, a circumference of a top surface of each projection collapses. Thus, the circumference of each of the projections is rounded off to enable to obtain a lens shape. In the invention, an inorganic film is used to form lenses; accordingly, the invention can be applied in the middle of a semiconductor process. Furthermore, owing to the irradiation of the inert gas ions, the atoms or molecules at a circumference of a top surface of each projection are moved toward the circumference of the bottom portion; accordingly, without necessitating much microfabrication, a distance between lenses can be easily brought closer.

Furthermore, as one mode according to the invention, depositing, on the inorganic film that was patterned according to the etching and irradiated with the inert gas ions, an inorganic film having the optical transparency may be further included. The process may be applied immediately after the irradiating inert gas ions or may be applied after undergoing other processes. In the depositing the inorganic film, for instance, the CVD method may be used. The inorganic film may be a silicon nitride film or a silicon oxide film. According to the mode, in the etching, without necessitating much microfabrication, a separation between lenses can be brought closer. Still furthermore, since a level of the microfabrication in the etching can be lowered, when another process is disposed between this process and the irradiating inert gas ions, operations thereof can be made easier.

A manufacturing method involving the invention of a solid-state image pickup device includes forming on a substrate on which a plurality of photodiodes is formed an inorganic film having the optical transparency; forming resist films at positions that are on the inorganic film and correspond to each of the photodiodes; etching a portion where the resist films are not formed of the inorganic film; removing the resist films that remain; and irradiating inert gas ions to the inorganic film from which the resist films are removed and that is patterned according to the etching.

According to an existing method, after a color filter and so on is provided to a solid-state image pickup device, a micro-lens (on-chip micro-lens) is formed on the uppermost layer. However, according to the invention, owing to the use of an inorganic film, in the middle of the manufacturing process, lenses can be formed. Furthermore, thus, separations between photodiodes and lenses can be brought closer. Still furthermore, owing to the irradiation of the inert gas ions, the atoms or molecules at a circumference of a top surface of each projection are moved toward a circumference of the recess; accordingly, without necessitating much microfabrication, separation between lenses can be easily brought closer.

Furthermore, a solid-state image pickup device involving the invention can be manufactured according to the above method. According to the invention, separations between the respective photodiodes and lenses can be made shorter and a separation between lenses can be made shorter.

DESCRIPTION OF THE PREFERRED EMBODIMENTS

Figure 1A:
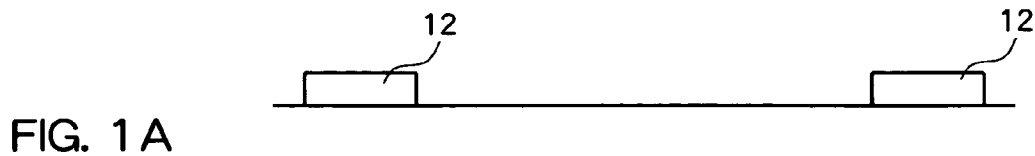
FIGS. 1A through 1G are sectional views of a solid-state image pickup device showing a manufacturing process of a solid-state image pickup device involving a first embodiment of the present invention.

In what follows, one embodiment according to the present invention will be explained with reference to the drawings.

FIGS. 1A through 1G are diagrams for explaining a manufacturing method of a solid-state image pickup device involving a first embodiment of the present invention. In the drawings, sectional views of a solid-state image pickup device substrate in the middle of manufacturing process are shown in order of processes.

According to a method involving the present embodiment, firstly as shown in FIG. 1A, a substrate on which micro-lenses are formed is prepared. The substrate may be a silicon wafer itself or one that has undergone one or a plurality of semiconductor manufacturing processes. Here, one in which metal films 12 are partially formed on a surface of a p-type silicon substrate 10 is used.

Figure 1B:
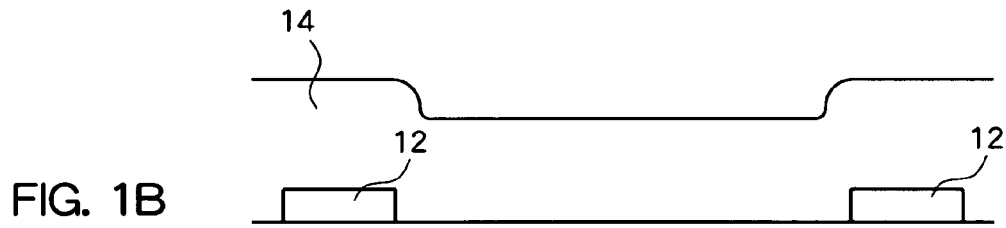

Subsequently, as shown in FIG. 1B, on the substrate shown in FIG. 1A a first lens base material layer 14 is deposited. The first lens base material layer 14 that is processed as part (or whole) of micro-lenses is a thin film made of an inorganic material that has the nature of allowing light passing, that is, the optical transparency. Here, a silicon nitride film will be used; however, other optically transparent inorganic film such as a silicon oxide film may be used. The first lens base material layer 14 may be deposited by use of various deposition techniques such as the CVD (Chemical Vapor Deposition) method and PVD (Physical Vapor Deposition) method.

Figure 1C:
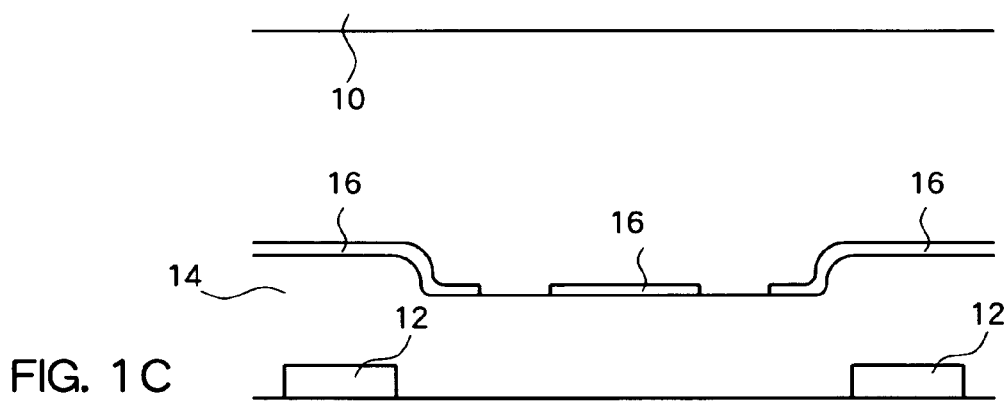

Subsequently, as shown in FIG. 1C, a mask is formed at least on a position where a lens is being formed. A magnitude of the mask is made a little smaller than a necessary lens size. Here, after a resist is coated on the first lens base material layer 14, a pattern is formed by means of exposure, thereby a portion where a resist film 16 is not formed around a position corresponding to a lens is formed and the resist film 16 is formed in other region. The resist film 16 thus patterned may be formed of a positive resist or a negative resist.

Figure 1D:
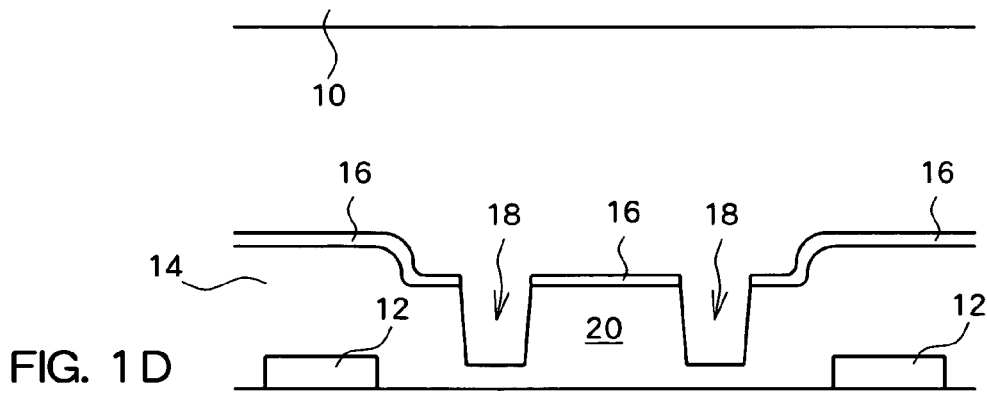
Figure 1E:
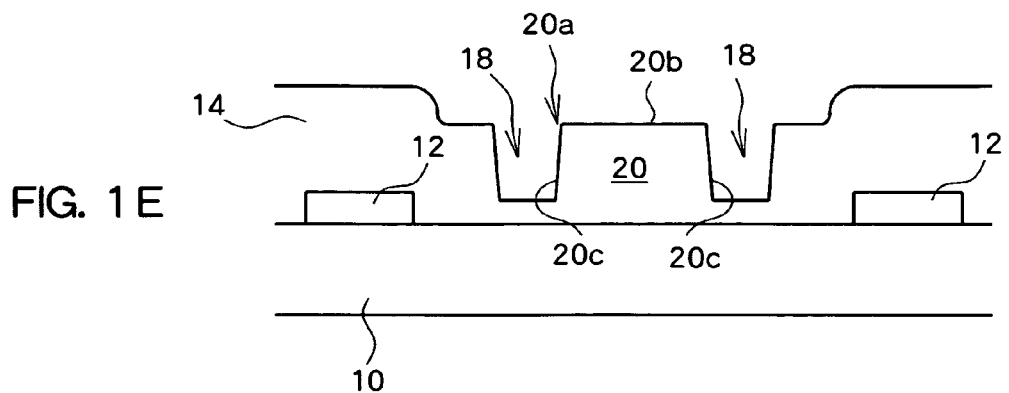

In the next place, as shown in FIG. 1D, the substrate on which the resist film 16 is formed thus is etched. The etching may be dry etching or wet etching. An amount of etching is desirably performed in the range of a film thickness of the first lens base material 14. An amount of etching may be determined according to a height necessary for the lens. Thus, in the first lens base material layer 14, a projection 20 surrounded by a recess 18 is formed. Subsequently, as shown in FIG. 1E, the resist film 16 is removed. Thus, a top surface 20b of the projection 20 is exposed.

Thereafter, to the substrate where a lens periphery is thus etched and the resist film 16 is removed, inert gas ions are irradiated. The irradiation of inert gas ions is applied with an intention of rounding off a corner portion 20a of the projection 20. Here, argon ion is used as the inert gas ion but other inert gas ion may be irradiated. When argon ions are irradiated on the substrate, it may be applied in such a manner that by use of an ion stream etch device manufactured by Tokyo Ohka Kogyo Co., Ltd., argon plasma is formed, and by applying an electric field to the plasma argon ions are irradiated (collided) onto the substrate. At this time, the energy of motion of the argon ions are controlled in its magnitude so as to ablate bonds of surface atoms or molecules of the first lens base material layer 14 and allow recombining with other atoms or molecules in an irradiation direction (so that the surface atoms or molecules may move only to the corner of the recess 18 or its neighborhood).

Figure 1F:
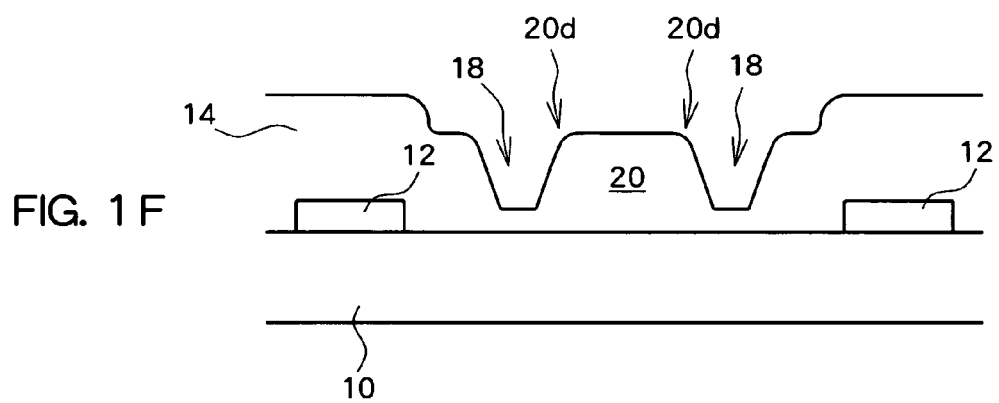

FIG. 1F shows a sectional view of a substrate undergone the irradiating inert gas ions. As shown in the drawing, the corner portion 20a of the projection 20 is rounded off, and the rounded-off portion moves toward around a side surface 20c and the corner of the recess 18. Thus, the projection 20 constituted of an inorganic film, as if collapsing, forms a curvature portion 20d at a top surface periphery portion of the projection 20, and thereby the projection 20 is processed in lens. Just a shape same as one that is obtained by means of the thermal reflow of an organic film can be obtained according to the present process.

Figure 1G:
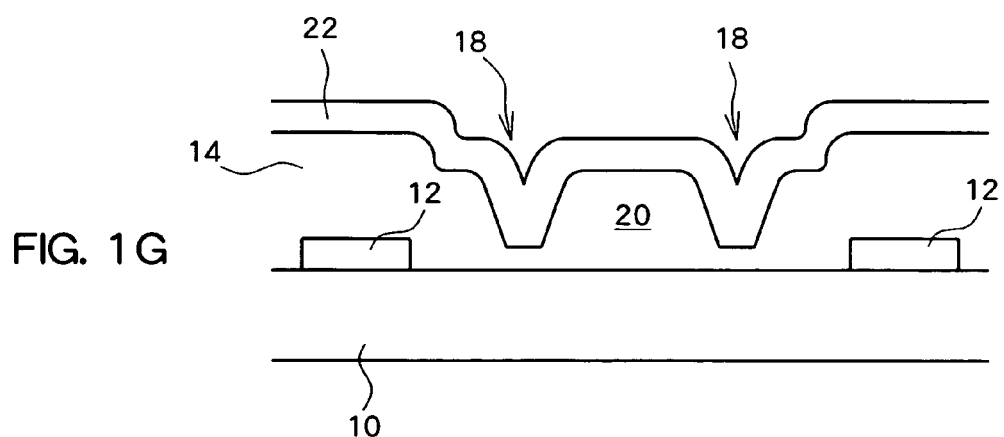

After that, as shown in FIG. 1G, on thus processed first lens base material layer 14, a second lens base material layer 22 is further deposited. The second lens base material layer 22 that is processed as part of a micro-lens is a thin film made of an inorganic material having the optical transparency. Here, a silicon nitride film is used; however, other optically transparent inorganic film such as a silicon oxide film may be used. The second lens base material layer 22 also may be deposited by means of various kinds of deposition techniques such as the CVD method and PVD method.

Between the irradiating inert gas ions and the depositing the second base material layer 22, another process may be disposed. For instance, a process of forming a metal film and so on at a position other than the projection 20 and the recess 18 may be interposed. In the embodiment, since the second lens base material 22 is deposited so as to obtain a final lens shape, and in a stage of the first lens base material 14 in between, a width of the recess 18 is not so much narrowed, a unnecessary metal film and so on can be advantageously easily removed from the recess 18. Furthermore, since the recess 18 can do without so much narrowing, without necessitating microfabrication, a lens separation can be narrowed. In the case of a metal film being formed, the second lens base material layer 22 may functionate as a passivation film (protective film) of the metal film.

In the embodiment, the micro-lens was obtained by laminating the first lens base material layer 14 and the second lens base material layer 22; however, a micro-lens may be obtained from the first base material layer 14 alone. In this case, when a width with which the etching is applied is narrowed in FIG. 1D or an amount of irradiation of the inert gas ions are increased in FIG. 1F, a lens separation can be made narrower.

Figure 2A:
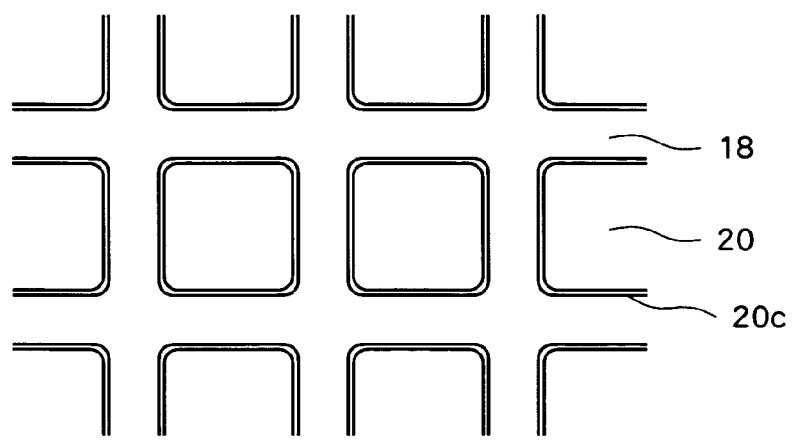
FIGS. 2A through 2C are plan views of a solid-state image pickup device showing a manufacturing process of a solid-state image pickup device involving a second embodiment of the present invention.
Figure 2B:
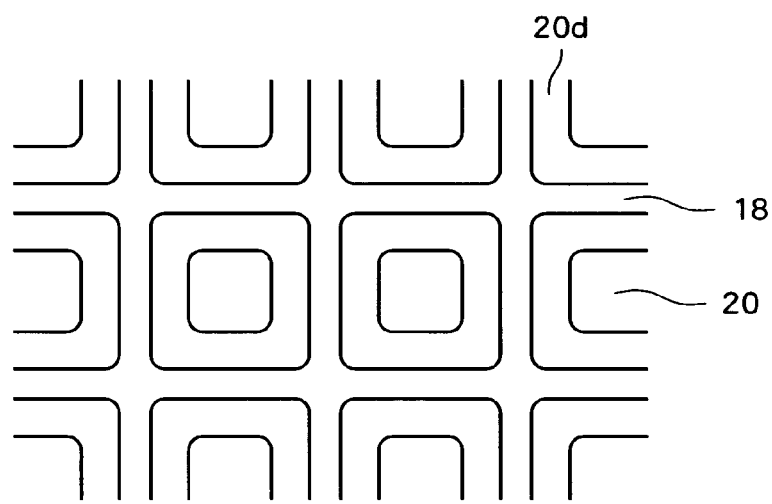
Figure 2C:
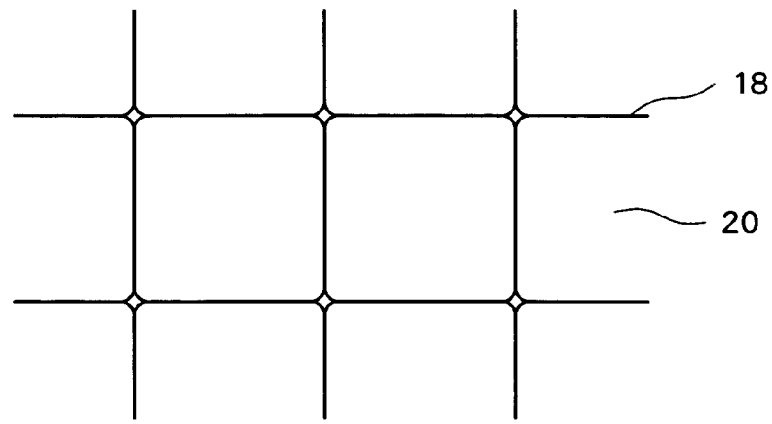

FIGS. 2A through 2C are diagrams showing a manufacturing method of a solid-state image pickup device involving a second embodiment. In FIGS. 2A through 2C, a manufacturing process of a solid-state image pickup device in which micro-lenses are arranged in array is shown. In the embodiment, firstly as shown in FIG. 2A, an inorganic film (first lens base material layer) having the optical transparency is selectively etched, thereby a recess 18 is formed around a position where each lens is formed, and thereby projections 20 are formed in positions where the lenses are formed (corresponding to FIG. 1E). Thereafter, as shown in FIG. 2B, inert gas ions are irradiated to round off corners of each projection 20, and thereby a curvature portion 20d is formed (corresponding to FIG. 1F). Furthermore, as shown in FIG. 2C, an inorganic film (second lens base material layer) having the optical transparency is deposited on the substrate thus obtained (corresponding to FIG. 1G). Thus, a micro-lens that is formed of an inorganic film having the optical transparency and has the heat resistance can be obtained.

According to the above embodiment, since the micro-lens is formed by use of the inorganic film, a highly heat resistant micro-lens can be formed. As a result, to the substrate provided with the micro-lenses, various kinds of semiconductor processes can be further applied. Furthermore, according to the irradiation of inert gas ions, atoms or molecules bound to a periphery of a top surface of the projections are moved in a direction of irradiation and allowed recombining, as it were, constituent atoms or molecules of the inorganic film are collapsed (since it can be done without grinding); accordingly, a degree of fineness of processing of the recess 18 and the projection 20 can be kept low, and thereby a lens separation can be easily brought closer. Furthermore, in the case of a lens shape being obtained by laminating the first lens base material layer 14 and the second lens base material layer 22, a degree of the fineness of the processing of the recess 18 and the projection 20 can be kept further lower.

The present invention is not restricted to the above embodiments. For instance, the manufacturing process of a micro-lens is not restricted to the above ones; as needs arise, other process may be interposed between the respective processes. Furthermore, the invention can be applied to not only the manufacture of the micro-lenses for solid-state image pickup devices but also the manufacture of micro-lenses provided to other optical devices such as liquid crystal display devices.

What is claimed is:

1. A manufacturing method of a micro-lens comprising:
   forming on a substrate an inorganic film having the optical transparency;
   forming, at a position that is on the inorganic film and correspond to a lens formation position, a resist film;
   etching a portion where the resist film is not formed of the inorganic film;
   removing the resist film that remains; and
   irradiating inert gas ions to the inorganic film from which the resist film is removed and that is patterned according to the etching.

2. The manufacturing method according to claim 1, wherein the forming the inorganic film includes depositing on the substrate a silicon nitride film or a silicon oxide film.

3. The manufacturing method according to claim 2, wherein the inert gas ions include argon ions.

4. The manufacturing method according to claim 2 further compromising:
   depositing, on the inorganic film that is patterned according to the etching and to which the inert gas ions are irradiated, an inorganic film having the optical transparency.

5. The manufacturing method according to claim 1, wherein the inert gas ions include argon ions.

6. The manufacturing method according to claim 1 further comprising:
   depositing, on the inorganic film that is patterned according to the etching and to which the inert gas ions are irradiated, an inorganic film having the optical transparency.

7. A manufacturing method of a solid-state image pickup device comprising:
   forming on a substrate on which a plurality of photodiodes is formed an inorganic film having the optical transparency;
   forming, at a position that is on the inorganic film and corresponds to each of the photodiodes, a resist film;
   etching a portion where the resist film is not formed of the inorganic film;
   removing the resist film that remains; and
   irradiating inert gas ions to the inorganic film from which the resist film is removed and that is patterned according to the etching.

8. A solid-state image pickup device manufactured according to the method according to claim 7.

* * * * *